(12) United States Patent
Zhou et al.

(10) Patent No.: US 11,994,945 B2
(45) Date of Patent: *May 28, 2024

(54) MANAGING WRITE DISTURB FOR UNITS OF MEMORY IN A MEMORY SUB-SYSTEM

(71) Applicant: Micron Technology, Inc., Boise, ID (US)

(72) Inventors: Zhenming Zhou, San Jose, CA (US); Tingjun Xie, Milpitas, CA (US); Charles See Yeung Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/296,595

(22) Filed: Apr. 6, 2023

(65) Prior Publication Data
US 2023/0244566 A1    Aug. 3, 2023

Related U.S. Application Data

(63) Continuation of application No. 17/467,826, filed on Sep. 7, 2021, now Pat. No. 11,656,936.

(51) Int. Cl.
*G06F 11/10* (2006.01)
*G06F 3/06* (2006.01)

(52) U.S. Cl.
CPC .......... *G06F 11/106* (2013.01); *G06F 3/0619* (2013.01); *G06F 3/0659* (2013.01); *G06F 3/0679* (2013.01); *G06F 11/1068* (2013.01)

(58) Field of Classification Search
CPC .. G06F 11/1068; G06F 3/0679; G06F 3/0659; G06F 3/0619; G06F 11/106
See application file for complete search history.

(56) References Cited

U.S. PATENT DOCUMENTS 10,127,974 B2   11/2018   Kim
10,566,048 B2    2/2020   Qin
(Continued)

OTHER PUBLICATIONS

PCT Notification of Transmittal Of The International Search Report And The Written Opinion Of The International Searching Authority for PCT Application No. PCT/US2022/042548, dated Dec. 22, 2022, 9 pages.

*Primary Examiner* — Guy J Lamarre
(74) *Attorney, Agent, or Firm* — Lowenstein Sandler LLP

(57) ABSTRACT

Disclosed is a system that comprises a memory device and a processing device, operatively coupled with the memory device, to perform operations that include, determining that a value of a write counter associated with the memory device satisfies a first threshold criterion, wherein the write counter is a global counter indicating a number of write operations to the memory device. The operations performed by the processing device further include determining that a set of failed bit count statistics corresponding to a plurality of codewords of a memory unit satisfies a second threshold criterion. The operations performed by the processing device further include, responsive to determining that the set of failed bit count statistics corresponding to the plurality of codewords of the memory unit satisfies the second threshold criterion, performing a write scrub operation on the memory unit.

20 Claims, 5 Drawing Sheets

(56) References Cited

U.S. PATENT DOCUMENTS

| | | | |
|---|---|---|---|
| 11,656,936 B2* | 5/2023 | Zhou | .................... G06F 3/0679 714/764 |
| 2010/0169726 A1 | 7/2010 | Kasuga | |
| 2013/0238955 A1 | 9/2013 | D'Abreu | |
| 2017/0287568 A1 | 10/2017 | Yang | |
| 2018/0081545 A1 | 3/2018 | Hong | |
| 2019/0096492 A1 | 3/2019 | Cai | |
| 2019/0355415 A1 | 11/2019 | Bradshaw | |
| 2019/0361806 A1 | 11/2019 | Hwang | |
| 2020/0050400 A1 | 2/2020 | Kim | |
| 2021/0241845 A1 | 8/2021 | Li | |

* cited by examiner

300 

```
┌─────────────────────────────────────────────────────────────┐
│ Determine that a value of a write counter associated with a │
│ memory device satisfies a first threshold criterion 301     │
└─────────────────────────────────────────────────────────────┘
                            │
┌─────────────────────────────────────────────────────────────┐
│ Identify a first memory unit and a second memory unit of the│
│                   memory device 303                         │
└─────────────────────────────────────────────────────────────┘
                            │
┌─────────────────────────────────────────────────────────────┐
│   Perform a read operation on the second memory unit 305    │
└─────────────────────────────────────────────────────────────┘
                            │
┌─────────────────────────────────────────────────────────────┐
│ Determine that a set of failed bit count statistics         │
│ corresponding to a plurality of codewords of the second     │
│ memory unit satisfies a second threshold criterion 307      │
└─────────────────────────────────────────────────────────────┘
                            │
┌─────────────────────────────────────────────────────────────┐
│  Perform a write scrub operation on the second memory unit  │
│                            309                              │
└─────────────────────────────────────────────────────────────┘
```

FIG. 3

MANAGING WRITE DISTURB FOR UNITS OF MEMORY IN A MEMORY SUB-SYSTEM

RELATED APPLICATIONS

The present application is a continuation of co-pending U.S. patent application Ser. No. 17/467,826, filed on Sep. 7, 2021, which is incorporated herein by reference in its entirety for all purposes.

TECHNICAL FIELD

Embodiments of the disclosure relate generally to memory sub-systems, and more specifically, relate to managing write disturb for units of memory in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a flow diagram of an example method to manage write disturb for units of memory in a memory device, in accordance with some embodiments of the present disclosure.

DETAILED DESCRIPTION

Figure 1:
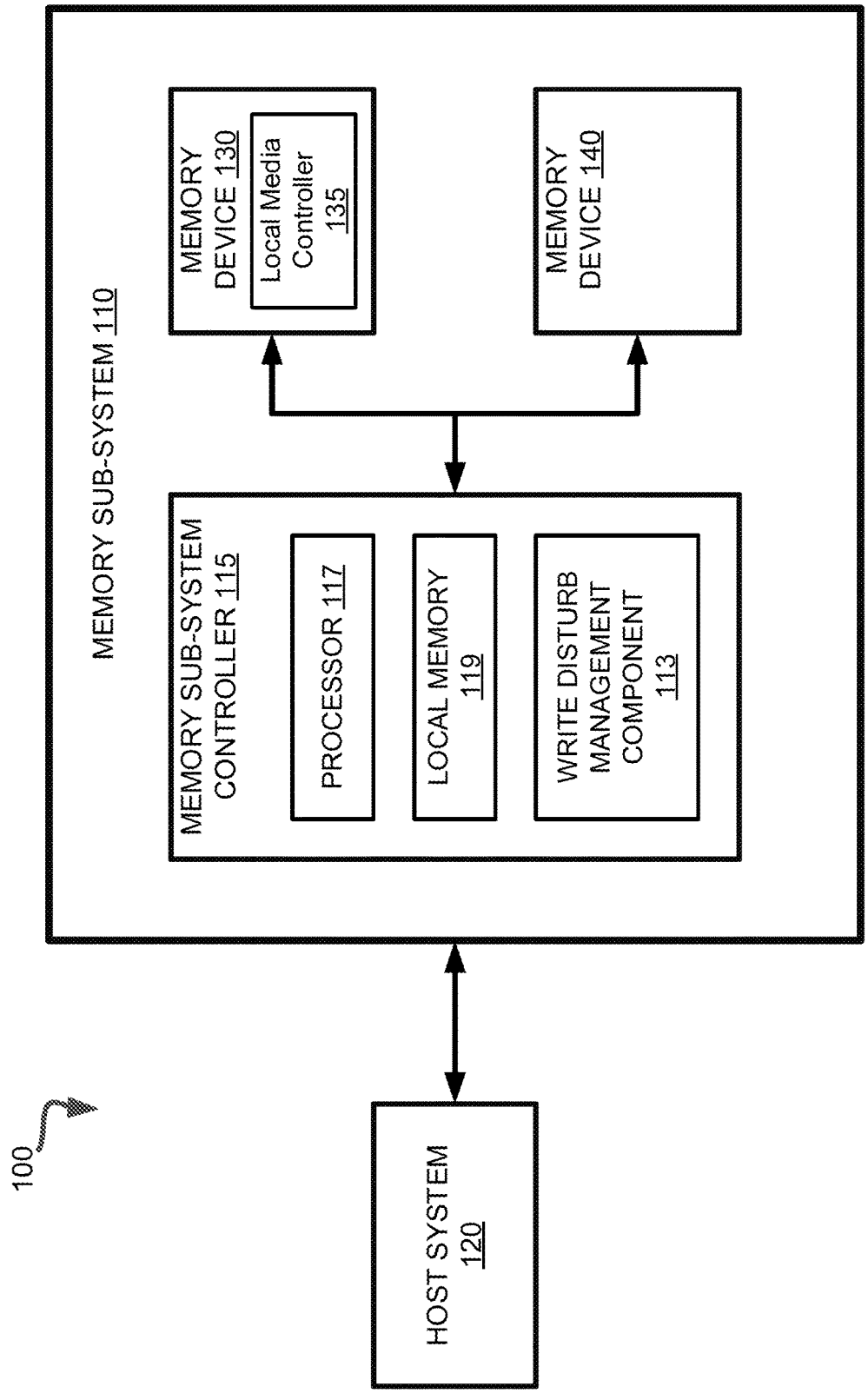
FIG. 1 illustrates an example computing system that includes a memory sub-system in accordance with some embodiments of the present disclosure.

Aspects of the present disclosure are directed to managing write disturb for units of memory in a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example of non-volatile memory devices is a three-dimensional cross-point ("3D cross-point") memory device that is a cross-point array of non-volatile memory that can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

The memory sub-system can encode data into a format for storage at the memory device. For example, a class of error detection and correcting codes (ECC) can be used to encode the data. Encoded data written to physical memory cells of the memory device can be referred to as a codeword. The codeword can include one or more of user/host data, error correcting code, metadata, or other information. The memory sub-system can consist of one or more codewords.

The memory device can include one or more units of memory. Each memory unit can include one or more memory cells (e.g., a page, a block, or some other translation unit (TU)). Each codeword of the memory device can include data from a memory unit. In certain memory devices, when data is written to a memory unit, adjacent (e.g., contiguous, neighboring, nearby, next to, etc.) memory units can experience what is known as "write disturb." Write disturb is the result of continually writing data to a particular memory unit without writing and/or refreshing data stored at nearby memory units, causing the nearby memory units to change state over time (e.g., the programmed state changes). If too many write operations are performed on the particular memory unit (also referred to as the "aggressor" hereinafter), data stored at adjacent or proximate memory units (also referred to as the "victim" hereinafter) of the memory device can become corrupted or incorrectly stored. The heat generated from the aggressor unit during the write operations can cause the memory alloy of the victim unit to crystalize, degrading its quality. For example, a bit of the adjacent or proximate memory units that may have originally been stored as a 0 may be flipped to a 1. Thus, in traditional memory sub-systems, a higher error rate can result when reading the data stored at the adjacent or proximate memory units. The higher error rate (e.g., raw bit error rate, or RBER) from write disturb can cause uncorrectable error correction code (UECC) errors, which can result in a loss of the data stored at the victim memory units. Thus, there can be a decrease in the reliability of data due to write disturb. The higher error rate can also increase the use of an error detection and correction operation (e.g., an error correction operation) for subsequent operations (e.g., read and/or write) performed on the memory unit. The increased use of the error correction operation can result in a reduction of the performance of the memory sub-system. As more resources of the memory sub-system are used to perform the error control operation, fewer resources can be used to perform other read operations or write operations. Thus, the performance of the memory sub-system can be decreased as fewer read operations and write operations can be performed within a particular amount of time.

Due to intrinsic product design and thermal transfer mechanism in certain memory devices, the write disturb effect can be different based on the direction from which the write disturb effect arrives at a given memory unit. For example, a victim memory unit can safely tolerate write disturb aggressions in one direction (e.g., a horizontal direction on a bitline) but can have more serious damage from write disturb aggressions in another direction (e.g., a vertical direction on a wordline). Additionally, the write disturb effect can also exhibit variations based on the layer of memory units where the memory unit is located. For example, a victim memory unit can safely tolerate write disturb aggressions on one layer of memory units, but another victim memory unit on another layer of memory units can experience a stronger write disturb effect from write disturb aggressions. A layer can be a deck of memory cells within a set of decks of a memory device, a plane within the memory device, or any other group of memory cells within the memory device. Accordingly, a write disturb elimination mechanism that takes into account the location of the memory unit as well as the direction of the write disturb can be desired.

To mitigate the effects of write disturb on data stored at the memory sub-system, certain memory sub-systems typically perform a write scrub operation on the victim memory units. For example, a memory sub-system can maintain a global write counter for a memory device. The memory sub-system can increment a value of the write counter in response to performing a write operation on a memory unit of the memory device. The memory sub-system can determine whether the value of the write counter satisfies a threshold criterion (e.g., a threshold number of write operations). If the value of the write counter satisfies the threshold criterion, the memory sub-system can identify the memory units adjacent to the memory unit. The memory sub-system can then perform a write scrub operation on the adjacent memory units. The write scrub operation can include reading data stored at the adjacent memory units, performing an error correction operation on the data, and writing the data back to the adjacent memory units, thereby mitigating any write disturb effect on the adjacent memory units. However, this approach can affect the throughput performance of the memory sub-system, since multiple memory access operations including a read operation and write operation are performed on adjacent memory units, thus consuming time and resources of the memory sub-system. Further, this approach includes performing the write scrub operation once the value of the write counter satisfies a threshold criterion, which can result in unnecessary write scrub operations to adjacent memory units that have not yet experienced write disturb effect. To avoid the impact on performance, certain memory sub-systems can choose to allow write disturb effect on adjacent memory units with no write disturb mitigation. However, as explained above, write disturb on adjacent memory units can result in a decrease in data reliability (e.g., data loss) and a decrease in performance. Therefore, mitigating write disturb for memory units without a decrease in performance can be desired.

Aspects of the present disclosure address the above and other deficiencies by providing a memory sub-system that mitigates write disturb for units of memory in a memory device. Each memory unit can include one or more memory cells. In certain embodiments, a memory sub-system controller can determine that a value of a write counter associated with the memory device satisfies a threshold criterion (e.g., the value of the write counter satisfies a threshold number of write operations). In response to determining that the value of the write counter satisfies the threshold criterion, the memory sub-system controller can identify a memory unit of the memory device currently being written. The memory sub-system controller can identify another memory unit having one or more memory cells adjacent to one or more memory cells of the memory unit currently being written. The memory sub-system controller can perform a read operation on the other memory unit. The memory sub-system controller can determine that a set of failed bit count statistics of a set of codewords of the other memory unit satisfies another threshold criterion. In response to determining that the set of failed bit counts of the set of codewords for the other memory unit satisfies the other threshold criterion, the memory sub-system controller can perform a write scrub operation on the other memory unit. In certain embodiments, the memory sub-system controller can determine that a value of a random or pseudo-random number associated with the memory device satisfies a threshold criterion (e.g., is greater than a threshold number). In response to determining that the value of the random or pseudo-random number associated with the memory device satisfies the threshold criterion, the memory sub-system controller can identify a memory unit of the memory device currently being written. The memory sub-system controller can identify another memory unit having one or more memory cells adjacent to one or more memory cells of the memory unit currently being written. The memory sub-system controller can perform a read operation on the other memory unit. The memory sub-system controller can determine that a set of failed bit count statistics of a set of codewords of the other memory unit satisfies another threshold criterion. In response to determining that the set of failed bit counts of the set of codewords for the other memory unit satisfies the other threshold criterion, the memory sub-system controller can perform a write scrub operation on the other memory unit.

Advantages of the present disclosure include, but are not limited to mitigating write disturb for memory units on a memory device without a decrease in throughput performance or decrease in data reliability due to write disturb. As discussed herein above, the current approaches in conventional memory sub-systems do not mitigate write disturb for units of memory without also impacting the performance of the memory sub-system. Unlike current solutions, aspects of the present disclosure enable a memory sub-system controller to perform write scrub operations only after determining that the value of a write counter satisfies a threshold criterion and performing a read operation on memory units adjacent to a memory unit currently being written to, in order to determine whether a set of failed bit count statistics satisfy another threshold criterion. Thus, the write scrub operation is only performed on the adjacent memory units when the set of failed bit count statistics satisfy the other threshold criterion indicating that the adjacent memory units is at risk for write disturb effect. Further, since a read operation is already performed on the adjacent memory units, the write scrub operation does not need to include another read operation, thereby saving resources. Thus, there is an improvement in both the reliability and performance of the memory device.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. Some types of memory, such as 3D cross-point, can group pages across dice and channels to form management units (MUs).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical MU address, physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

The memory sub-system 110 includes a write disturb management component 113 that can eliminate write disturb for system metadata of a memory device (e.g., the memory device 130). In some embodiments, the memory sub-system controller 115 includes at least a portion of the write disturb management component 113. In some embodiments, the write disturb management component 113 is part of the host system 110, an application, or an operating system. In other embodiments, local media controller 135 includes at least a portion of the write disturb management component 113 and is configured to perform the functionality described herein.

The write disturb management component 113 can determine that a value of a global write counter associated with the memory device satisfies a threshold criterion (e.g., the value of the write counter is greater than or equal to a threshold number of write operations). In response to determining that the value of the write counter satisfies the threshold criterion, the write disturb management component 113 can identify a memory unit of the memory device currently being written. The write disturb management component 113 can identify another memory unit having one or more memory cells adjacent to one or more memory cells of the memory unit currently being written. The write disturb management component 113 can perform a read operation on the other memory unit. The write disturb management component 113 can determine that a set of failed bit count statistics of a set of codewords of the other memory unit satisfies another threshold criterion. In response to determining that the set of failed bit counts of the set of codewords for the other memory unit satisfies the other threshold criterion, the write disturb management component 113 can perform a write scrub operation on the other memory unit. In certain embodiments, the write disturb management component 113 can determine that a value of a random or pseudo-random number associated with the memory device satisfies a threshold criterion (e.g., is greater than a threshold number). In response to determining that the value of the random or pseudo-random number associated with the memory device satisfies the threshold criterion, the write disturb management component 113 can identify a memory unit currently being written. The write disturb management component 113 can identify another memory unit having one or more memory cells adjacent to one or more memory cells of the memory unit currently being written. The write disturb management component 113 can perform a read operation on the other memory unit. The write disturb management component 113 can determine that a set of failed bit count statistics of a set of codewords of the other memory unit satisfies another threshold criterion. In response to determining that the set of failed bit counts of the set of codewords for the other memory unit satisfies the other threshold criterion, the write disturb management component 113 can perform a write scrub operation on the other memory unit. Further details with regards to the operations of the write disturb management component 113 are described below.

Figure 2:
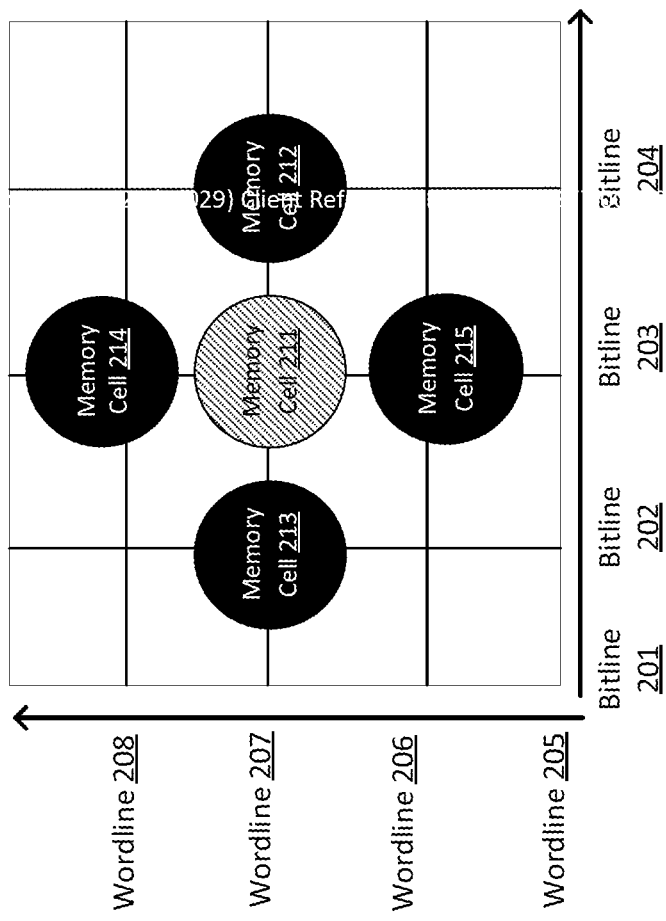
FIG. 2 illustrates an example memory unit causing a write disturb effect on adjacent memory units of a memory device, in accordance with some embodiments of the present disclosure.

FIG. 2 illustrates an example memory cell causing a write disturb effect on adjacent memory cells of a memory device, in accordance with embodiments of the disclosure. In one implementation, a memory cell 211 is adjacent to a memory cell 214 and a memory cell 215 vertically on a bitline 203. Memory cell 211 is also adjacent to a memory cell 212 and a memory cell 213 horizontally on a wordline 207. In one implementation, the memory device can include a shared bitline having a number of pillars extending to a separate source line. Each pillar can be a vertical conductive trace and the intersections of each pillar and each wordline forms a memory unit (e.g., a memory cell). In this case, each memory unit has four adjacent neighboring memory units abutting its bitline-wordline intersection from the north, east, south, and west directions. In one implementation, the memory cell 211 can be part of one or more memory cells of a memory unit. In one implementation, the memory cells 212, 213, 214, and 215 can be part of one or more memory cells of one or more memory units.

In some implementations, when a write operation is performed to the memory cell 211, the voltage stage of each neighboring memory cell is altered, thus eventually resulting in a degree of distortion of data of the neighboring memory cells. In this case, memory cell 211 can be referred to as an aggressor, and its neighboring memory cells 212-215 can be referred to as victims. In certain implementations, distortion of data of the victim memory cells 212-215 can result in data loss as explained above. In certain memory devices and/or layers of the memory device that are prone to write disturb errors on bitlines, only memory cells 215 and 214 on the bitline 203 experience write disturb errors as explained above. In certain memory devices and/or layers of the memory device that are prone to write disturb errors on wordlines, only memory cells 212 and 213 on the wordline 207 experience write disturb errors as explained above. In some implementations, certain memory devices and/or layers of the memory device are prone to write disturb errors on neither bitlines nor wordlines but are prone to write disturb errors depending on the particular layer of the memory device. Accordingly, a write scrub operation can be performed on each victim memory unit 212-215, which can include performing an error correction operation on the data stored at each memory unit 212-215 and then writing the data back to the same memory units 212-215, thus mitigating the effect of the write disturb caused by the aggressor memory unit 211, as explained in more detail herein below.

FIG. 3 is a flow diagram of an example method 300 to manage write disturb for units of memory in a memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 301, the processing logic determines that a value of a write counter associated with the memory device satisfies a threshold criterion. The write counter can be a global counter for host-initiated write operations to the memory device. In some embodiments, the value of the write counter can be stored in a data structure, e.g., a table. Determining that the value of the write counter satisfies the threshold criterion can include determining that the value of the write counter is greater than or equal to a threshold number of write operations performed on the memory device. In some embodiments, the threshold criterion can be based on offline media characteristics of the memory device. The threshold criterion can vary depending on the characteristics of the memory device. In some embodiments, the processing logic performs a write operation on a memory unit of the memory device. The memory unit can include one or more memory cells residing on the memory device. The write operation can be performed in response to receiving a write command from a host system. In response to performing the write operation, the processing logic can increment the value of the write counter associated with the memory device. Incrementing the value of the write counter can include updating a corresponding entry in the data structure with the value. In some embodiments, if the processing logic determines that the value of the write counter does not satisfy the threshold criterion (e.g., is less than the threshold number), the processing logic can determine whether another write command is received from the host system. In response to receiving the other write command, the processing logic can increment the value of the write counter.

At operation 303, the processing logic identifies a memory unit of the memory device currently being written to. In some embodiments, the processing logic identifies the memory unit in response to determining that the value of the write counter satisfies the threshold criterion. In response to identifying the memory unit, the processing logic can identify another memory unit including one or more memory cells residing on the memory device adjacent to the one or more memory cells of the memory unit. In some embodiments, the processing logic can identify the other memory unit based on a physical address associated with the other memory unit. In some embodiments, the memory unit can be an aggressor memory unit, and the other memory unit can be a victim memory unit.

At operation 305, the processing logic performs a read operation on the other memory unit. In some embodiments, performing the read operation on the other memory unit can include reading data stored on the one or more memory cells of the other memory unit.

At operation 307, the processing logic determines that a set of failed bit count statistics satisfies another threshold criterion (e.g., is greater than another threshold number). The set of failed bit count statistics can be associated with a set of codewords of the other memory unit. The set of codewords can include data from the other memory unit. The other threshold criterion can be based on offline media characteristics of the memory device. The other threshold criterion can vary depending on the characteristics of the memory device. In some embodiments, determining that the set of failed bit count statistics satisfies the other threshold criterion includes determining a failed bit count for each codeword of the set of codewords of the other memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can identify a codeword of the set of codewords with a maximum number of failed bit counts. For example, the processing logic can compare the failed bit count of each codeword to identify the failed bit count with the highest value. The processing logic can determine that the codeword with the maximum number of failed bit counts satisfies the other threshold criterion (e.g., is greater than the other threshold number).

In some embodiments, determining that the set of failed bit count statistics satisfies the other threshold criterion can include determining a failed bit count for each codeword of the set of the codewords of the memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can calculate an average number of failed bit counts among the set of codewords. In some embodiments, the processing logic can determine a total number of failed bit counts of the set of codewords. The processing logic can determine the total number of failed bit counts of the set of codewords by additively computing a value associated with the failed bit count for each codeword. The processing logic can calculate the average number of failed bit counts based on the total number of failed bit counts and a number of codewords associated with the failed bit count. The processing logic can determine that the average number of failed bit counts satisfies the other threshold criterion.

In some embodiments, determining that the set of failed bit count statistics satisfies the other threshold criterion can include determining a failed bit count for a codeword of the set of codewords of the other memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can identify each codeword of the set of codewords associated with the failed bit count that is greater than a threshold number of failed bit counts. The processing logic can determine that the identified codeword satisfies the other threshold criterion.

In some embodiments, the set of failed bit count statistics can include one or more of the following as described above: the codeword with the maximum number of failed bit counts, the set of codewords having an average number of failed bit counts greater than the threshold criterion, and/or the codeword associated with a failed bit count greater than the threshold number of failed bit counts. In some embodiments, in response to the processing logic determining that the set of failed bit count statistics does not satisfy the other threshold criterion, the processing logic can reset the value of the counter to an initial value (e.g., 0). Resetting the value of the counter to the initial value can include updating the corresponding entry in the data structure with the initial value. The processing logic can then perform operations 301-309 as described herein.

At operation 309, the processing logic performs a write scrub operation on the other memory unit. In some embodiments, the processing logic performs the write scrub operation in response to determining that the set of failed bit count statistics satisfies the other threshold criterion. In some embodiments, performing the write scrub operation can include performing an error correction operation on data stored on the one or more memory cells of the other memory unit. The processing logic can write the data back to the other memory unit in response to performing to error correction operation on the data. In some embodiments, the processing logic resets the value of the write counter to the initial value (e.g., 0).

Figure 4:
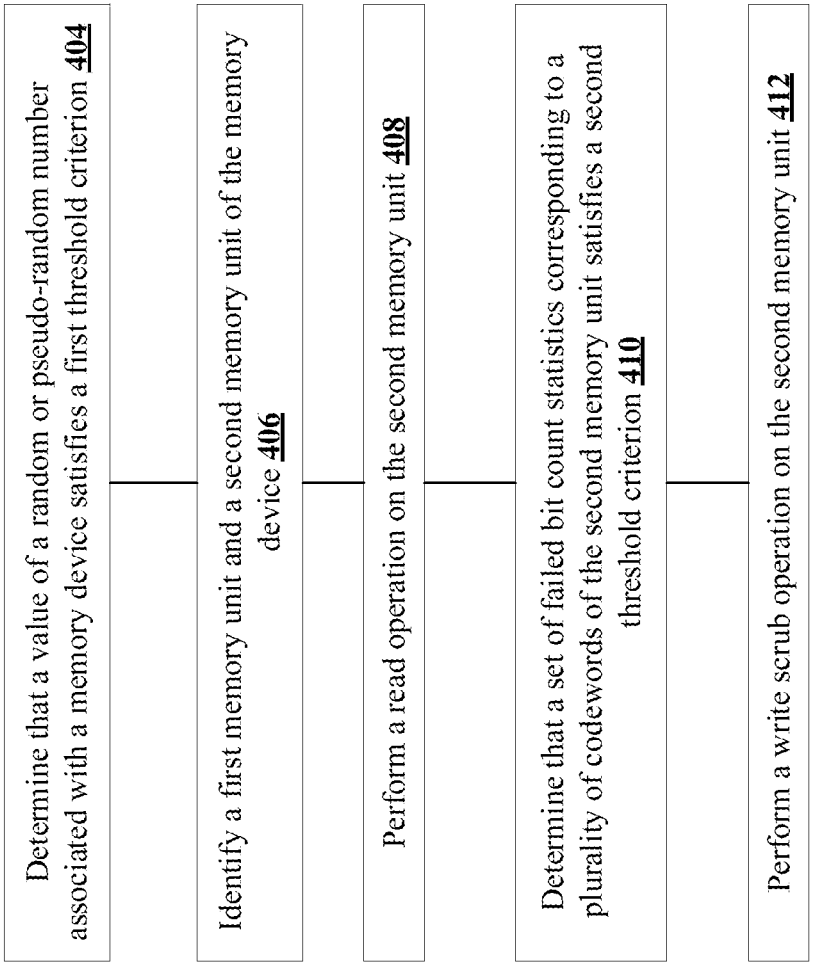
FIG. 4 is a flow diagram of an example method to manage write disturb for units of memory in a memory device, in accordance with some embodiments of the present disclosure.

FIG. 4 is a flow diagram of an example method 400 to manage write disturb for units of memory in a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the write disturb management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 404, the processing logic determines that a value of a random or pseudo-random number associated with the memory device satisfies a threshold criterion. In some embodiments, the value of the random or pseudo-random number can be stored in a data structure, e.g., a table. Determining that the value of the random or pseudo-random number satisfies the threshold criterion can include determining that the value of the random or pseudo-random number is greater than or equal to a threshold number. In some embodiments, the threshold criterion can be based on offline media characteristics of the memory device. The threshold criterion can vary depending on the characteristics of the memory device. In some embodiments, the processing logic performs a write operation on a memory unit of the memory device. The memory unit can include one or more memory cells residing on the memory device. The write operation can be performed in response to receiving a write command from a host system. In response to performing the write operation, the processing logic can generate the random or pseudo-random number. Generating the random or pseudo-random number can be done using a random number generator algorithm. In some embodiments, if the processing logic determines that the value of the random or pseudo-random number does not satisfy the threshold criterion (e.g., is less than the threshold criterion), the processing logic can determine whether another write command is received from the host system. In response to receiving the other write command, the processing logic can generate another random or pseudo-random number.

At operation 406, the processing logic identifies a memory unit of the memory device currently being written to. In some embodiments, the processing logic identifies the memory unit in response to determining that the value of the random or pseudo-random number satisfies the threshold criterion. The processing logic can identify another memory unit having one or more memory cells adjacent to one or more memory cells of the memory unit currently being written. In some embodiments, the processing logic can identify the other memory unit based on a physical address associated with the other memory unit. In some embodiments, the memory unit can be an aggressor memory unit, and the other memory unit can be a victim memory unit.

At operation 408, the processing logic performs a read operation on the other memory unit. In some embodiments, performing the read operation on the other memory unit can include reading data stored on the one or more memory cells of the other memory unit.

At operation 410, the processing logic determines that a set of failed bit count statistics satisfies another threshold criterion (e.g., is greater than the threshold criterion). The set of failed bit count statistics can correspond to a set of codewords of the other memory unit. The set of codewords can include data from the other memory unit. The other threshold criterion can be based on offline media characteristics of the memory device. The other threshold criterion can vary depending on the characteristics of the memory device. In some embodiments, determining that the set of failed bit count statistics satisfies the other threshold criterion includes determining a failed bit count for each codeword of the set of codewords of the other memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can identify a codeword of the set of codewords with a maximum number of failed bit counts. For example, the processing logic can compare the failed bit count of each codeword to identify the failed bit count with the highest value. The processing logic can determine that the codeword with the maximum number of failed bit counts satisfies the other threshold criterion (e.g., is greater than the other threshold number).

In some embodiments, determining that the set of failed bit count statistics satisfies the other threshold criterion can include determining a failed bit count for each codeword of the set of the codewords of the memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can calculate an average number of failed bit counts among the set of codewords. In some embodiments, the processing logic can determine a total number of failed bit counts of the set of codewords. The processing logic can determine a total number of failed bit counts of the set of codewords by additively computing a value associated with the failed bit count for each codeword. The processing logic can calculate the average number of failed bit counts based on the total number of failed bit counts and the number of codewords associated with the failed bit count. The processing logic can determine that the average number of failed bit counts satisfies the other threshold criterion.

In some embodiments, determining that the set of failed bit count statistics satisfies the other threshold criterion can include determining a failed bit count for a codeword of the set of codewords of the other memory unit. In one embodiment, the failed bit count can indicate a directional number of bit flips associated with each codeword from one specific logic state to another logic state. In one embodiment, the directional number of bit flips can include the number of bits that have flipped from a logic state of 0 to a logic state of 1. In one embodiment, the directional number of bit flips can include the number of bits that have flipped from a logic state of 1 to a logic state of 0. The processing logic can identify each codeword of the set of codewords associated with the failed bit count that is greater than a threshold number of failed bit counts. The processing logic can determine that the identified codeword satisfies the other threshold criterion.

In some embodiments, the set of failed bit count statistics can include one or more of the following as described above: the codeword with the maximum number of failed bit counts, the set of codewords having an average number of failed bit counts greater than the threshold criterion, and/or the codeword associated with a failed bit count greater than the threshold number of failed bit counts. In some embodiments, in response to the processing logic determining that the set of failed bit count statistics does not satisfy the other threshold criterion, the processing logic can determine whether another write command is received from the host system. In response to receiving the other write command, the processing logic can generate another random or pseudo-random number. The processing logic can then perform operations 404-412 as described herein.

At operation 412, the processing logic performs a write scrub operation on the other memory unit. In some embodiments, the processing logic performs the write scrub operation in response to determining that the set of failed bit count statistics satisfies the other threshold criterion. In some embodiments, performing the write scrub operation can include performing an error correction operation on data stored on the one or more memory cells of the other memory unit. The processing logic can write the data back to the other memory unit in response to performing to error correction operation on the data. In some embodiments, in response to performing the write scrub operation, the processing logic determines whether another write command is received from the host system. In response to receiving the other write command, the processing logic can generate another random or pseudo-random number. The processing logic can then perform operations 404-412 as described herein.

Figure 5:
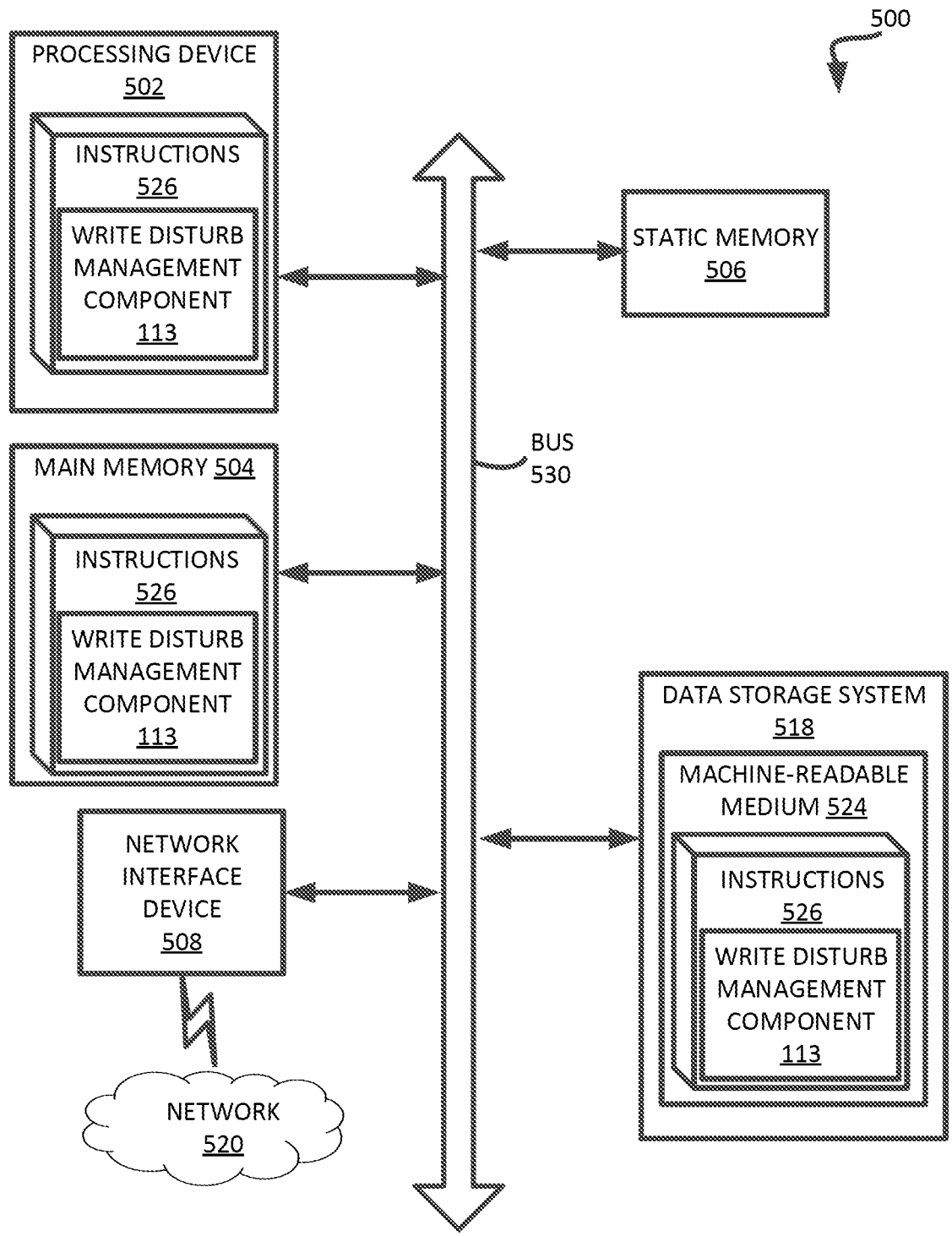
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the write disturb management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 608 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a write disturb management component (e.g., the write disturb management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
determining that a value of a write counter associated with the memory device satisfies a first threshold criterion, wherein the write counter is a global counter indicating a number of write operations to the memory device;
determining that a set of failed bit count statistics corresponding to a plurality of codewords of a memory unit of the memory device satisfies a second threshold criterion; and
responsive to determining that the set of failed bit count statistics corresponding to the plurality of codewords of the memory unit satisfies the second threshold criterion, performing a write scrub operation on the memory unit.

2. The system of claim 1, further comprising:
resetting the value of the write counter to an initial value.

3. The system of claim 1, further comprising:
responsive to performing a write operation to the memory device, incrementing the value of the write counter.

4. The system of claim 1, wherein determining that the set of failed bit count statistics corresponding to the plurality of codewords of the memory unit satisfies the second threshold criterion comprises:
determining a failed bit count corresponding to each codeword of the plurality of codewords, wherein the failed bit count indicates a number of bit flips;
identifying a codeword of the plurality of codewords with a maximum failed bit count; and
determining that the codeword with the maximum failed bit count satisfies the second threshold criterion.

5. The system of claim 1, wherein determining that the set of failed bit count statistics corresponding to the plurality of codewords of the memory unit satisfies the second threshold criterion comprises:
determining a total number of failed bit counts corresponding to the plurality of codewords, wherein the total number of failed bit counts indicates a number of bit flips;
calculating an average number of failed bit counts based on the total number of failed bit counts; and
determining that the average number of failed bit counts satisfies the second threshold criterion.

6. The system of claim 1, wherein determining that the set of failed bit count statistics corresponding to the plurality of codewords of the memory unit satisfies the second threshold criterion comprises:
determining a failed bit count corresponding to each codeword of the plurality of codewords, wherein the failed bit count indicates a number of bit flips;
determining that the failed bit count is greater than a threshold number of failed bit counts; and
determining that the codeword associated with the failed bit count satisfies the second threshold.

7. The system of claim 1, wherein performing the write scrub operation on the memory unit comprises:
performing an error correction operation on data from the memory unit; and
writing the data back to the memory unit.

8. A method comprising:
determining that a value of a write counter associated with a memory device satisfies a first threshold criterion, wherein the write counter is a global counter indicating a number of write operations to the memory device;
determining that a set of failed bit count statistics corresponding to a plurality of codewords of a memory unit of the memory device satisfies a second threshold criterion; and
responsive to determining that the set of failed bit count statistics corresponding to the plurality of codewords of the memory unit satisfies the second threshold criterion, performing a write scrub operation on the memory unit.

9. The method of claim 8, further comprising:
resetting the value of the write counter to an initial value.

10. The method of claim 8, wherein determining that the set of failed bit count statistics corresponding to the plurality of codewords of the memory unit satisfies the second threshold criterion comprises:
determining a failed bit count corresponding to each codeword of the plurality of codewords, wherein the failed bit count indicates a number of bit flips;
identifying a codeword of the plurality of codewords with a maximum failed bit count; and
determining that the codeword with the maximum failed bit count satisfies the second threshold criterion.

11. The method of claim 8, wherein determining that the set of failed bit count statistics corresponding to the plurality of codewords of the memory unit satisfies the second threshold criterion comprises:
determining a total number of failed bit counts corresponding to the plurality of codewords, wherein the total number of failed bit counts indicates a number of bit flips;
calculating an average number of failed bit counts based on the total number of failed bit counts; and
determining that the average number of failed bit counts satisfies the second threshold criterion.

12. The method of claim 8, wherein determining that the set of failed bit count statistics corresponding to the plurality of codewords of the memory unit satisfies the second threshold criterion comprises:
determining a failed bit count corresponding to each codeword of the plurality of codewords, wherein the failed bit count indicates a number of bit flips;
determining that the failed bit count is greater than a threshold number of failed bit counts; and
determining that the codeword associated with the failed bit count satisfies the second threshold.

13. The method of claim 8, wherein performing the write scrub operation on the memory unit comprises:
performing an error correction operation on data from the memory unit; and
writing the data back to the memory unit.

14. A non-transitory computer-readable storage medium comprising instructions that, when executed by a processing device, cause the processing device to perform operations comprising:
determining that a value of a write counter associated with a memory device satisfies a first threshold criterion, wherein the write counter is a global counter indicating a number of write operations to the memory device;
determining that a set of failed bit count statistics corresponding to a plurality of codewords of a memory unit of the memory device satisfies a second threshold criterion; and responsive to determining that the set of failed bit count statistics corresponding to the plurality of codewords of the memory unit satisfies the second threshold criterion, performing a write scrub operation on the memory unit.

15. The non-transitory computer-readable storage medium of claim 14, wherein the processing device is to perform operations further comprising:
resetting the value of the write counter to an initial value.

16. The non-transitory computer-readable storage medium of claim 14, wherein the processing device is to perform operations further comprising:
responsive to performing a write operation to the memory device, incrementing the value of the write counter.

17. The non-transitory computer-readable storage medium of claim 14, wherein to determine that the set of failed bit count statistics corresponding to the plurality of codewords of the memory unit satisfies the second threshold criterion, the processing device is to perform operations further comprising:
determining a failed bit count corresponding to each codeword of the plurality of codewords, wherein the failed bit count indicates a number of bit flips;
identifying a codeword of the plurality of codewords with a maximum failed bit count; and
determining that the codeword with the maximum failed bit count satisfies the second threshold criterion.

18. The non-transitory computer-readable storage medium of claim 14, wherein to determine that the set of failed bit count statistics corresponding to the plurality of codewords of the memory unit satisfies the second threshold criterion, the processing device is to perform operations further comprising:
determining a total number of failed bit counts corresponding to the plurality of codewords, wherein the total number of failed bit counts indicates a number of bit flips;
calculating an average number of failed bit counts based on the total number of failed bit counts; and
determining that the average number of failed bit counts satisfies the second threshold criterion.

19. The non-transitory computer-readable storage medium of claim 14, wherein to determine that the set of failed bit count statistics corresponding to the plurality of codewords of the memory unit satisfies the second threshold criterion, the processing device is to perform operations further comprising:
determining a failed bit count corresponding to each codeword of the plurality of codewords, wherein the failed bit count indicates a number of bit flips;
determining that the failed bit count is greater than a threshold number of failed bit counts; and
determining that the codeword associated with the failed bit count satisfies the second threshold.

20. The non-transitory computer-readable storage medium of claim 14, wherein to perform the write scrub operation on the memory unit, the processing device is to perform operations further comprising:
performing an error correction operation on data from the memory unit; and
writing the data back to the memory unit.

* * * * *